(12) United States Patent
Tanabe et al.

(10) Patent No.: US 9,949,370 B2
(45) Date of Patent: Apr. 17, 2018

(54) SUSPENSION BOARD WITH CIRCUIT AND PRODUCING METHOD THEREOF

(71) Applicant: NITTO DENKO CORPORATION, Osaka (JP)

(72) Inventors: Hiroyuki Tanabe, Osaka (JP); Naohiro Terada, Osaka (JP); Yuu Sugimoto, Osaka (JP); Daisuke Yamauchi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/373,583

(22) Filed: Dec. 9, 2016

(65) Prior Publication Data

US 2017/0171970 A1     Jun. 15, 2017

(30) Foreign Application Priority Data

Dec. 11, 2015 (JP) ................... 2015-242586

(51) Int. Cl.
| | |
|---|---|
| H05K 1/03 | (2006.01) |
| H05K 1/05 | (2006.01) |
| H05K 3/22 | (2006.01) |
| H05K 3/46 | (2006.01) |
| G11B 5/48 | (2006.01) |
| H05K 1/11 | (2006.01) |
| H05K 3/34 | (2006.01) |

(52) U.S. Cl.
CPC .............. *H05K 1/05* (2013.01); *G11B 5/483* (2015.09); *G11B 5/4853* (2013.01); *H05K 1/117* (2013.01); *H05K 3/22* (2013.01); *H05K 3/3442* (2013.01); *H05K 3/4608* (2013.01); *H05K 3/4644* (2013.01); *H05K 2201/10151* (2013.01); *H05K 2201/10227* (2013.01); *Y02P 70/613* (2015.11)

(58) Field of Classification Search
CPC . H05K 1/05; H05K 1/03; H05K 1/117; H05K 3/22; G11B 5/483
USPC ................. 174/255, 250, 251, 256–261
See application file for complete search history.

(56) References Cited

U.S. PATENT DOCUMENTS

2016/0037632 A1* 2/2016 Murakawa ........... H05K 3/1208
174/257

FOREIGN PATENT DOCUMENTS

JP        2012-099204 A      5/2012

\* cited by examiner

*Primary Examiner* — Tremesha S Willis
(74) *Attorney, Agent, or Firm* — Edwards Neils LLC; Jean C. Edwards, Esq.

(57) ABSTRACT

A suspension board with circuit includes a metal supporting board, a base insulating layer disposed at one side in a thickness direction of the metal supporting board, a conductor layer disposed at the one side of the base insulating layer and including a connecting terminal electrically connected to a slider, a cover insulating layer covering the conductor layer to expose the connecting terminal and disposed at the one side of the base insulating layer, and a plating layer covering the connecting terminal. The cover insulating layer includes a first cover insulating layer disposed at the one side of the base insulating layer and a second cover insulating layer disposed at the one side of the first cover insulating layer, and the thickness of the plating layer is not more than the total sum of the thickness of the first cover insulating layer and that of the second cover insulating layer.

3 Claims, 7 Drawing Sheets

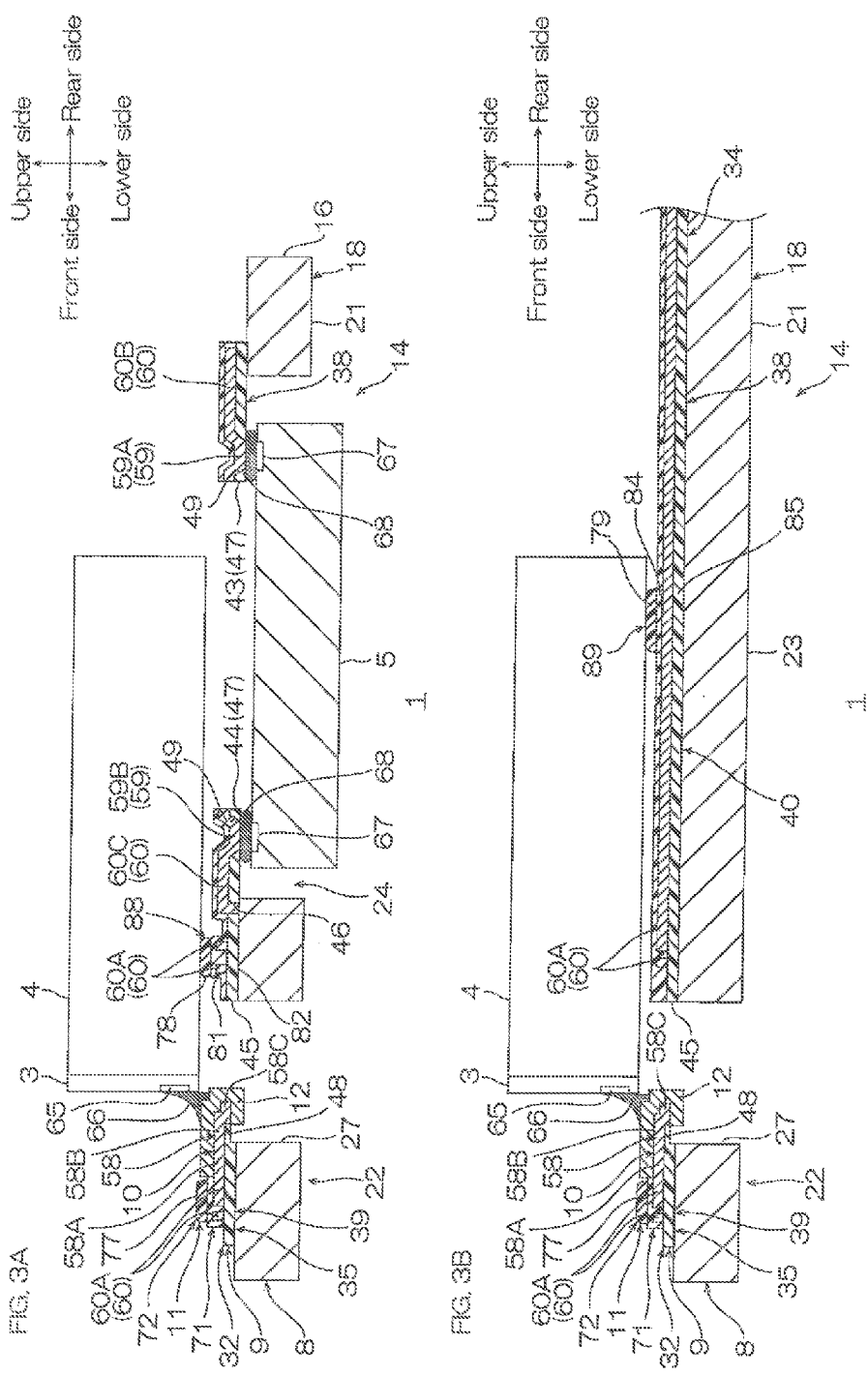

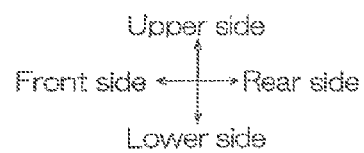
FIG. 4A
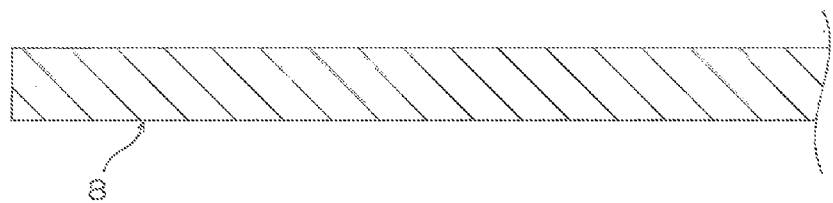
FIG. 4B
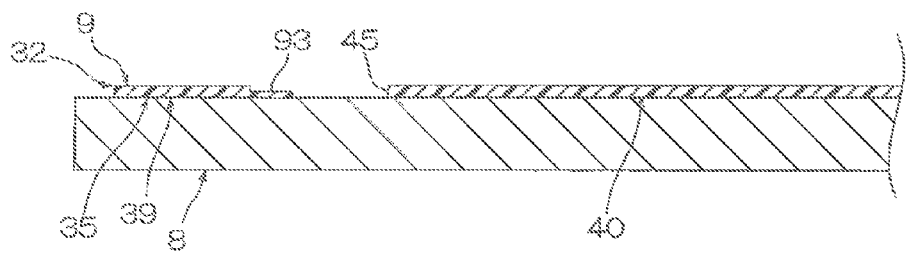
FIG. 4C
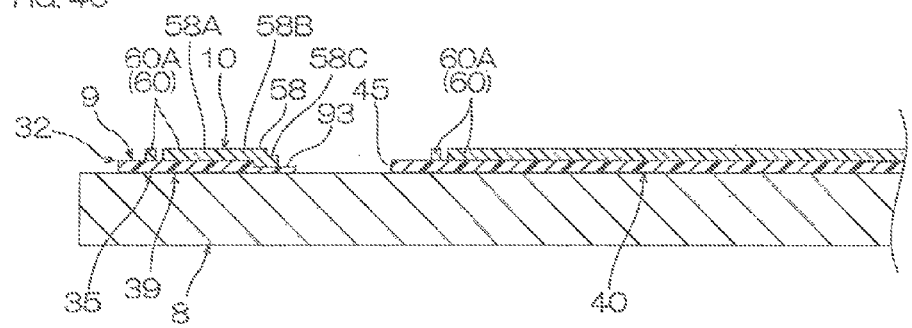

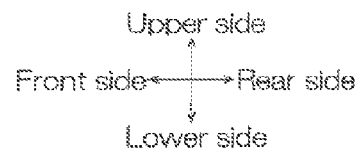
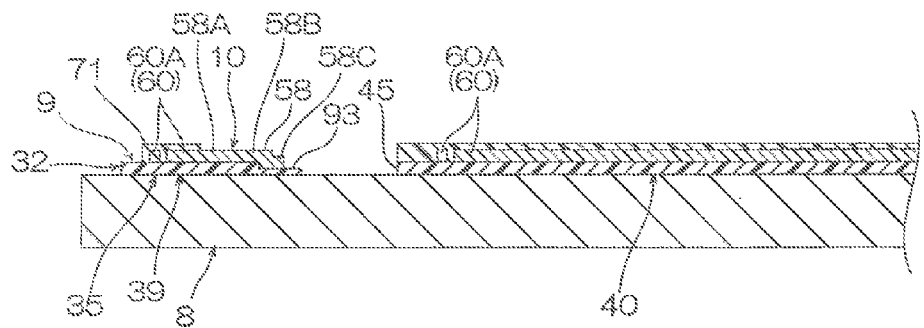
FIG. 5D
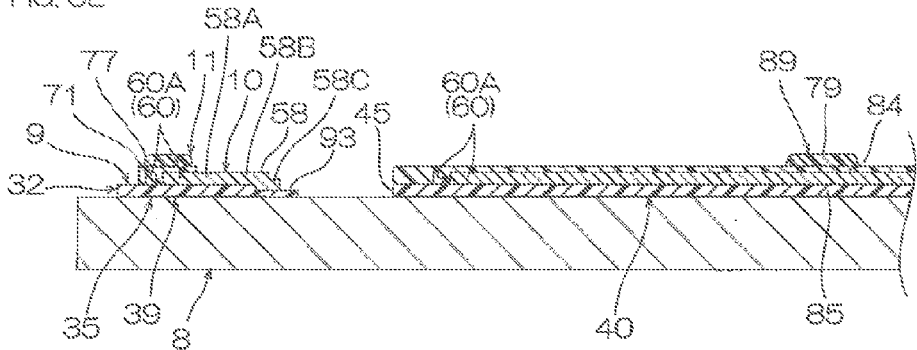
FIG. 5E
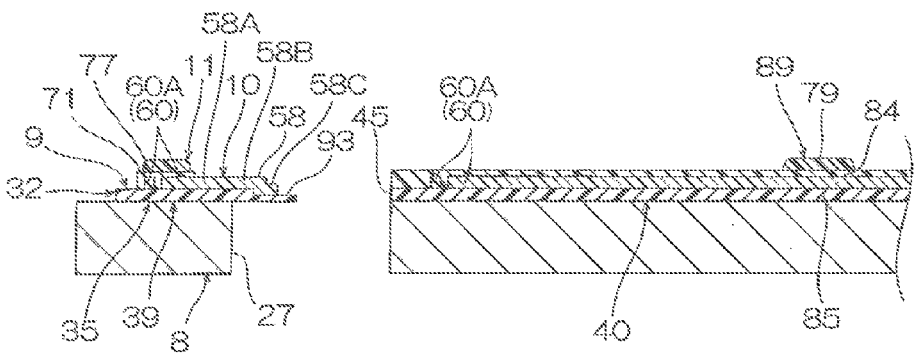
FIG. 5F

SUSPENSION BOARD WITH CIRCUIT AND PRODUCING METHOD THEREOF

CROSS-REFERENCE TO RELATED APPLICATION

The present application claims priority from Japanese Patent Application No. 2015-242586 filed on Dec. 11, 2015, the contents of which are hereby incorporated by reference into this application.

BACKGROUND OF THE INVENTION

Field of the Invention

The present invention relates to a suspension board with circuit, to be specific, to a suspension board with circuit used for a hard disk drive, and a producing method thereof.

Description of Related Art

Conventionally, a suspension board with circuit on which a slider including a magnetic head is mounted is mounted on a hard disk drive.

In such a suspension board with circuit, a head-side terminal is electrically connected to a terminal of the magnetic head of the slider by a solder ball (ref: for example, Japanese Unexamined Patent Publication No. 2012-099204).

SUMMARY OF THE INVENTION

In the suspension board with circuit described in Japanese Unexamined Patent Publication No. 2012-099204, however, the head-side terminal is spaced apart from the terminal of the magnetic head in a thickness direction. When the space therebetween is large, there may be a case where the contact area of the head-side terminal and the terminal of the magnetic head cannot be ensured at the time of melting of the solder bell, causing a contact failure.

It is an object of the present invention to provide a suspension board with circuit that is capable of surely connecting a connecting terminal to a terminal of a slider, and a producing method thereof.

The present invention [1] includes a suspension board with circuit including a metal supporting board, a base insulating layer disposed at one side in a thickness direction of the metal supporting board, a conductor layer disposed at one side in the thickness direction of the base insulating layer and including a connecting terminal electrically connected to a slider, a cover insulating layer covering the conductor layer so as to expose the connecting terminal and disposed at the one side in the thickness direction of the base insulating layer, and a plating layer covering the connecting terminal, wherein the cover insulating layer includes a first cover insulating layer disposed at the one side in the thickness direction of the base insulating layer and a second cover insulating layer disposed at one side in the thickness direction of the first cover insulating layer, and the thickness of the plating layer is not more than the total sum of the thickness of the first cover insulating layer and that of the second cover insulating layer.

According to the structure, the plating layer covering the connecting terminal can be surely protected by the first cover insulating layer and the second cover insulating layer.

Also, in accordance with the position of the slider, the thickness of the plating layer is appropriately adjusted within the total sum of the thickness of the first cover insulating layer and that of the second cover insulating layer, and the plating layer can be brought closer to the terminal of the slider in the thickness direction.

Thus, the connecting terminal can be surely connected to the terminal of the slider.

The present invention [2] includes the suspension board with circuit described in the above-described [1] further including a pedestal supporting the slider, wherein the pedestal includes a base pedestal layer made of the base insulating layer and disposed at the one side in the thickness direction of the metal supporting board, a first cover pedestal layer made of the first cover insulating layer and disposed at one side in the thickness direction of the base pedestal layer, and a second cover pedestal layer made of the second cover insulating layer and disposed at one side in the thickness direction of the first cover pedestal layer.

According to the structure, the base pedestal layer is made of the base insulating layer, the first cover pedestal layer is made of the first cover insulating layer, and the second cover pedestal layer is made of the second cover insulating layer, so that the pedestal can be formed without separately providing a member so as to support the slider.

The cover insulating layer is made of two layers of the first cover insulating layer and the second cover insulating layer, so that the thickness of the pedestal can be accurately adjusted.

The present invention [3] includes a method for producing a suspension board with circuit described in the above-described [2] including the steps of preparing the metal supporting board, forming the base insulating layer including the base pedestal layer at the one side in the thickness direction of the metal supporting board, forming the conductor layer including the connecting terminal at the one side in the thickness direction of the base insulating layer, forming the first cover insulating layer at the one side in the thickness direction of the base insulating layer so as to dispose the first cover pedestal layer at the one side in the thickness direction of the base pedestal layer, forming the second cover insulating layer at the one side in the thickness direction of the first cover insulating layer so as to dispose the second cover pedestal layer at the one side in the thickness direction of the first cover pedestal layer, and forming the plating layer in the connecting terminal.

According to the method, in the steps of forming the first cover insulating layer and the second cover insulating layer so as to protect the plating layer of the connecting terminal, the first cover pedestal layer and the second cover pedestal layer can be simultaneously formed.

Thus, the pedestal can be efficiently formed without separately adding a step, while the plating layer can be protected by the cover insulating layer.

BRIEF DESCRIPTION OF THE DRAWINGS

FIG. 3A shows a sectional view along an A-A line of the gimbal portion shown in FIG. 2.

FIG. 3B shows a sectional view along a B-B line of the gimbal portion shown in FIG. 2.

FIGS. 4A to 4C show process drawings for illustrating a method for producing the suspension board with circuit shown in FIG. 3B:

FIG. 4A illustrating a step of preparing a metal supporting board,

FIG. 4B illustrating a step of forming a base insulating layer, and

FIG. 4C illustrating a step of forming a conductor layer.

FIGS. 5D to 5F, subsequent to FIG. 4C, show process drawings for illustrating a method for producing the suspension board with circuit shown in FIG. 3B:

FIG. 5D illustrating a step of forming a first cover insulating layer,

FIG. 5E illustrating a step of forming a second cover insulating layer, and

FIG. 5F illustrating a step of processing the metal supporting board.

FIG. 6G illustrating a step of partially removing the base insulating layer,

FIG. 6H illustrating a step of forming a plating layer, and

FIG. 6I illustrating a step of mounting a slider.

DETAILED DESCRIPTION OF THE INVENTION

First Embodiment

Figure 1:
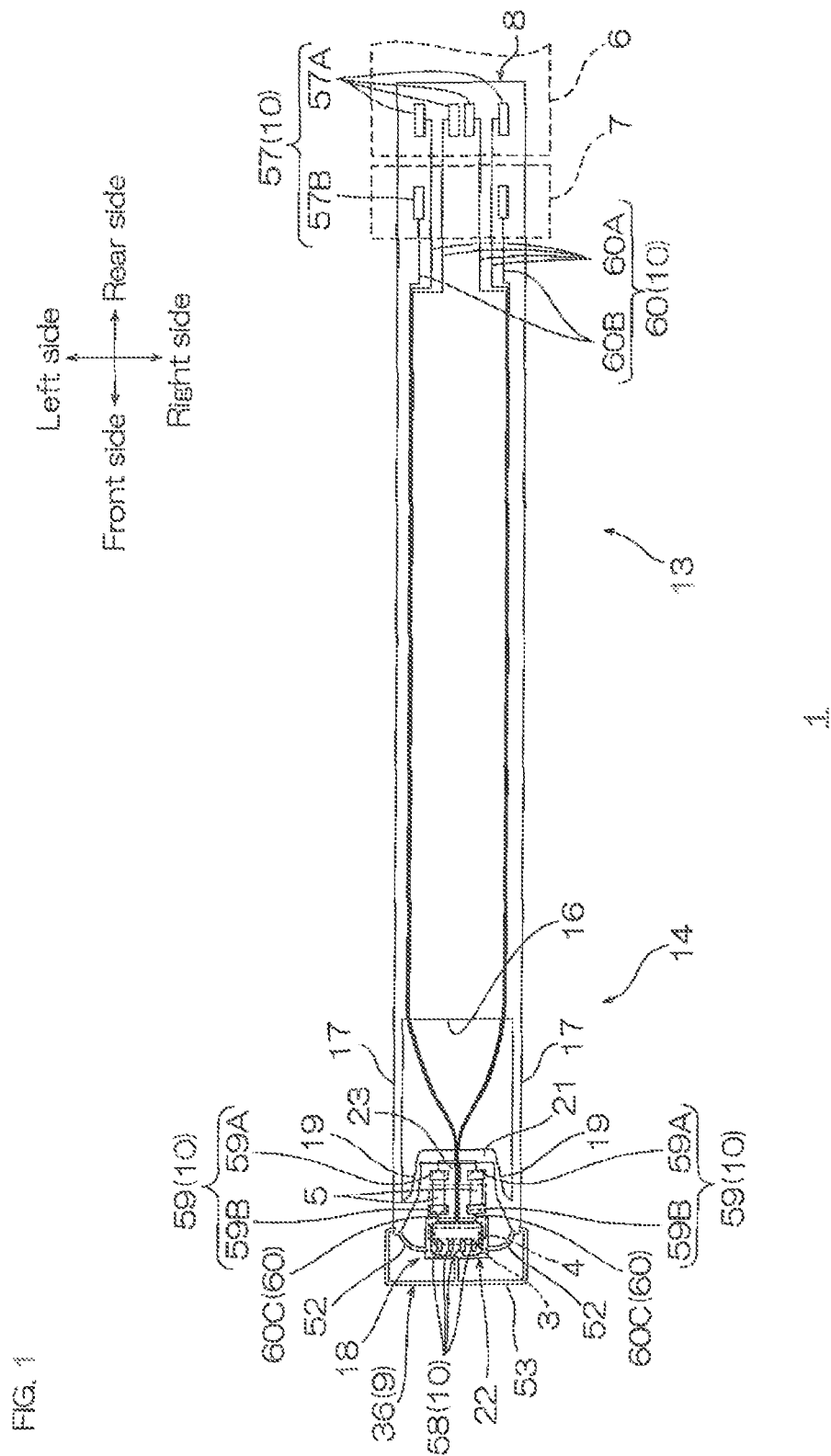
FIG. 1 shows a plan view of a first embodiment of a suspension board with circuit of the present invention.

A suspension board with circuit 1 shown in FIG. 1 is mounted with a slider 4 that is mounted with a magnetic head 3, and piezoelectric elements 5. An external board 6 and a power source 7 are connected thereto to be then mounted on a hard disk drive (not shown).

In FIG. 1, the right-left direction of the paper surface is referred to as a front-rear direction (first direction), the left side of the paper surface is referred to as a front side (one side in the first direction), and the right side of the paper surface is referred to as a rear side (the other side in the first direction). The up-down direction of the paper surface is referred to as a right-left direction (widthwise direction, second direction), the upper side of the paper surface is referred to as a left side (one side in the widthwise direction, one side in the second direction), and the lower side of the paper surface is referred to as a right side (the other side in the widthwise direction, the other side in the second direction). The paper thickness direction of the paper surface is referred to as an up-down direction (thickness direction, third direction), the near side of the paper surface is referred to as an upper side (one side in the thickness direction, one side in the third direction), and the far side of the paper surface is referred to as a lower side (the other side in the thickness direction, the other side in the third direction). To be specific, directions are in accordance with direction arrows in each view.

Figure 2:
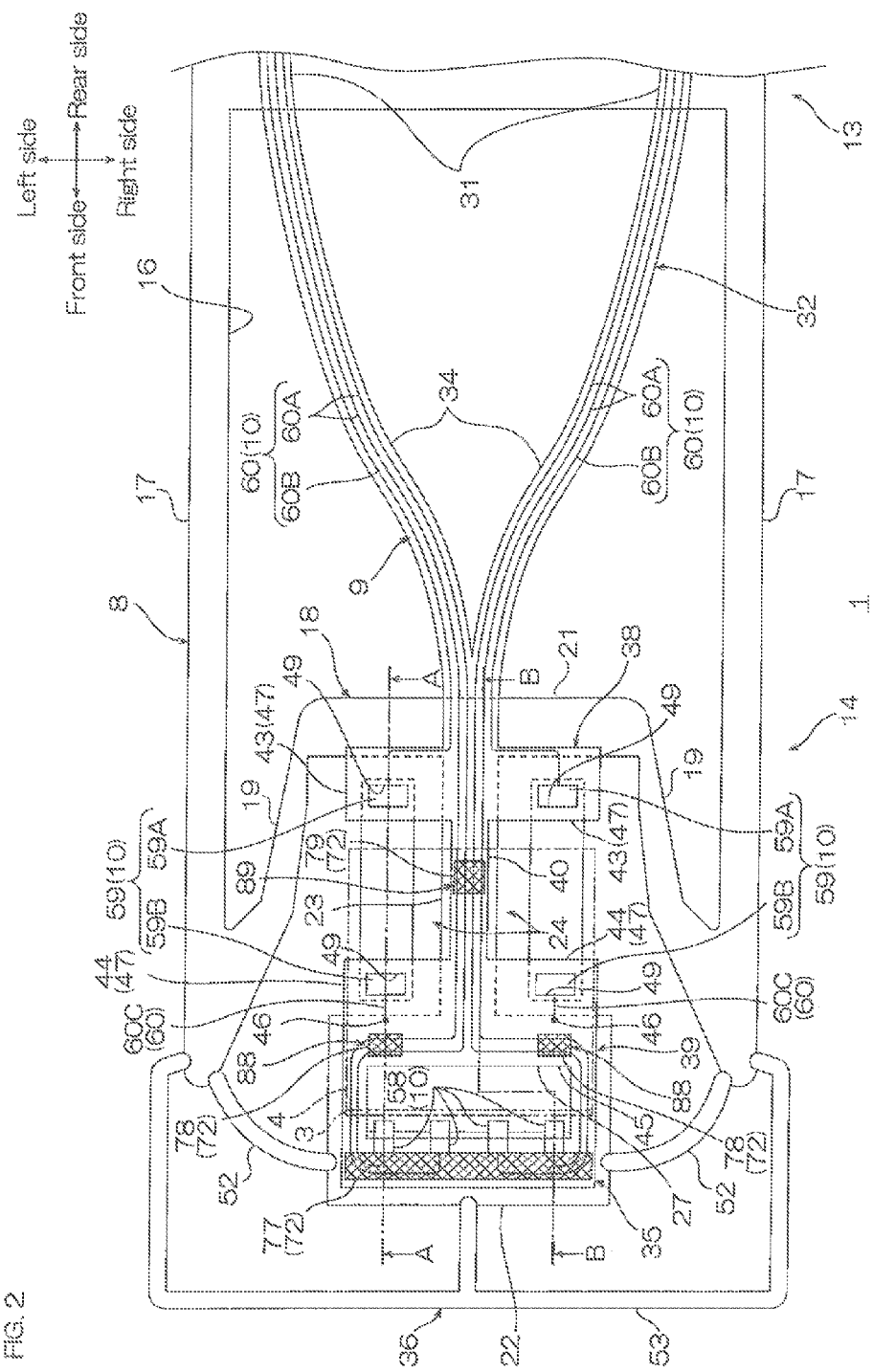
FIG. 2 shows a plan view of a gimbal portion of the suspension board with circuit shown in FIG. 1.

In FIG. 1, a base insulating layer 9 (described later) other than a bridged portion 36 (described later) and a cover insulating layer 11 (a first cover insulating layer 71 (described later) and a second cover insulating layer 72 (described later)) are omitted. In FIG. 2, the base insulating layer 9 (described later) and the second cover insulating layer 72 (described later) are illustrated, and the first cover insulating layer 71 (described later) is omitted.

As shown in FIG. 1, the suspension board with circuit 1 has a flat belt shape extending in the front-rear direction. As shown in FIGS. 3A and 3B, the suspension board with circuit 1 includes a metal supporting board 8, the base insulating layer 9 formed on the metal supporting board 8, a conductor layer 10 formed on the base insulating layer 9, the cover insulating layer 11 formed on the base insulating layer 9 so as to cover the conductor layer 10, and a plating layer 12 covering the surfaces of a plurality of terminals (external terminals 57, head-side terminals 58, and piezoelectric-side terminals 59) to be described later of the conductor layer 10.

As shown in FIG. 1, the metal supporting board 8 has a flat belt shape extending in the front-rear direction and integrally includes a main body portion 13 and a gimbal portion 14 formed at the front side of the main body portion 13.

The main body portion 13 has a generally rectangular shape in plan view extending in the front-rear direction. The main body portion 13 is supported by a load beam (not shown) of a hard disk drive, when the suspension board with circuit 1 is mounted on the hard disk drive.

As shown in FIG. 2, the gimbal portion 14 is formed so as to extend from the front end of the main body portion 13 forwardly.

The gimbal portion 14 includes one pair of outrigger portions 17, a mounting portion 18, and one pair of connecting portions 19.

The outrigger portions 17 have generally slender rectangular shapes in plan view and are formed as one pair so as to extend from both end portions in the widthwise direction of the main body portion 13 forwardly in linear shapes.

The mounting portion 18 is disposed at spaced intervals to the inner sides in the widthwise direction of the one pair of outrigger portions 17 and at spaced intervals to the front end edge of the main body portion 13 in the front-rear direction. The mounting portion 18 has a generally H-shape in plan view having an opening toward both sides in the widthwise direction. That is, both end portions in the widthwise direction of the central portion in the front-rear direction of the mounting portion 18 are cut out (have an opening). To be specific, the mounting portion 18 integrally includes a base portion 21, a stage 22, and a central portion 23.

The base portion 21 is disposed at the rear end portion of the mounting portion 18 and has a generally rectangular shape in plan view extending long in the widthwise direction.

The stage 22 is disposed at the front side of the base portion 21 at spaced intervals thereto and has a generally rectangular shape in plan view extending long in the widthwise direction. The stage 22 includes a stage opening portion 27.

As shown in FIGS. 2 and 3A, the stage opening portion 27 is formed so as to pass through the stage 22 in the thickness direction in a generally rectangular shape in plan view.

As shown in FIG. 2, the central portion 23 has a slender rectangular shape in plan view connecting the center in the widthwise direction of the base portion 21 to that in the widthwise direction of the stage 22 and extending in the front-rear direction. The central portion 23 is formed to be bendable and narrow in the widthwise direction.

In the mounting portion 18, the cut-out portion is defined as one pair of communicating spaces 24. The one pair of communicating spaces 24 are defined at both sides in the widthwise direction of the central portion 23 and formed so as to pass through the metal supporting board 8 in the thickness direction.

Each of the one pair of connecting portions 19 extends from each of the front end portions of the one pair of outrigger portions 17 toward obliquely inner rear side in the widthwise direction so as to be connected to both end portions in the widthwise direction of the base portion 21. In this manner, the one pair of connecting portions 19 connect the one pair of outrigger portions 17 to the mounting portion 18. In this manner, a board opening portion 16 in a generally U-shape having an opening forwardly in plan view is formed between the one pair of connecting portions 19 and the one pair of outrigger portions 17, and between the mounting portion 18 and the main body portion 13.

The metal supporting board 8 is, for example, formed of a metal material such as stainless steel, 42-alloy, aluminum, copper-beryllium, and phosphor bronze. Preferably, the metal supporting board 8 is formed of stainless steel.

The metal supporting board 8 has a thickness of, for example, 5 µm or more, or preferably 10 µm or more and, for example, 30 µm or less, or preferably 25 µm or less.

The base insulating layer 9 is formed on the upper surface of the metal supporting board 8 in a pattern corresponding to the conductor layer 10. To be specific, the base insulating layer 9 includes a main body portion-insulating layer 31 corresponding to the main body portion 13 and a gimbal portion-insulating layer 32 corresponding to the gimbal portion 14.

The main body portion-insulating layer 31 is formed so as to correspond to the conductor layer 10 (to be specific, the external terminals 57 and wires 60 to be described later) of the main body portion 13 shown in FIG. 1.

The gimbal portion-insulating layer 32 includes a board opening portion-insulating layer 34 corresponding to the board opening portion 16, a mounting portion-insulating layer 35 corresponding to the mounting portion 18, and the bridged portion 36.

The board opening portion-insulating layer 34 is formed so as to traverse the board opening portion 16 in the front-rear direction. To be specific, the board opening portion-insulating layer 34 has a generally Y-shape in plan view extending forwardly continuously from the front ends of both end portions in the widthwise direction of the main body portion-insulating layer 31 so as to pass the board opening portion 16; branching off toward both sides in the widthwise direction at the rear side of the board opening portion 16 to be unified at the rear side with respect to the base portion 21; and extending midway in the front-rear direction of the base portion 21.

The mounting portion-insulating layer 35 has a generally H-shape in plan view corresponding to the mounting portion 18. To be specific, the mounting portion-insulating layer 35 includes a base portion-insulating layer 38, a stage insulating layer 39, and a central portion-insulating layer 40.

The base portion-insulating layer 38 is formed corresponding to the conductor layer 10 in the base portion 21 of the mounting portion 18. The base portion-insulating layer 38 has a generally rectangular shape in plan view extending continuously from the board opening portion-insulating layer 34 toward both outer sides in the widthwise direction at the front side of the base portion 21 of the mounting portion 18. The base portion-insulating layer 38 is formed so as to extend forwardly with respect to the front end edge of the base portion 21. In the base portion-insulating layer 38, portions traversing the central portion 23 and exposed from the communicating spaces 24 in the mounting portion 18 are defined as one pair of rear piezoelectric-side terminal forming portions 43.

The stage insulating layer 39 is formed corresponding to the conductor layer 10 in the stage 22 of the mounting portion 18. The stage insulating layer 39 is disposed at the front side of the base portion-insulating layer 38 at spaced intervals thereto and has a generally rectangular shape in plan view extending from the front side of the stage 22 of the mounting portion 18 rearwardly with respect to the rear end edge of the stage 22. In the stage insulating layer 39, portions traversing the central portion 23 and exposed from the communicating spaces 24 in the mounting portion 18 are defined as one pair of front piezoelectric-side terminal forming portions 44. The stage insulating layer 39 includes a connecting terminal-opening portion 45 corresponding to the stage opening portion 27, a recessed portion 48 (ref: FIG. 3B), and a plurality (two pieces) of ground opening portions 46.

As shown in FIGS. 2 and 3A, the connecting terminal-opening portion 45 is formed so as to pass through the stage insulating layer 39 in the thickness direction in a generally rectangular shape. When projected in the thickness direction, both end edges in the widthwise direction and the rear end edge of the connecting terminal-opening portion 45 coincide with both end edges in the widthwise direction and the rear end edge of the stage opening portion 27. The front end edge of the connecting terminal-opening portion 45 is positioned rearwardly with respect to the front end edge of the stage opening portion 27.

The recessed portion 48 is disposed forwardly with respect to the front end edge of the connecting terminal-opening portion 45 and formed so as to dent from the lower surface of the stage insulating layer 39 upwardly in a portion overlapped with the stage opening portion 27, when projected in the thickness direction.

The ground opening portions 46 are formed so as to pass through the stage insulating layer 39 in the thickness direction in a portion overlapped with the rear end portion of the stage 22 of the mounting portion 18, when projected in the thickness direction.

As shown in FIG. 2, the central portion-insulating layer 40 is formed corresponding to the conductor layer 10 in the central portion 23 of the mounting portion 18. The central portion-insulating layer 40 has a slender rectangular shape in plan view connecting the center in the widthwise direction of the base portion-insulating layer 38 to that in the widthwise direction of the stage insulating layer 39 and extending in the front-rear direction. The central portion-insulating layer 40 is formed narrower than the central portion 23 and bendable in the widthwise direction.

The one pair of rear piezoelectric-side terminal forming portions 43 and the one pair of front piezoelectric-side terminal forming portions 44 make piezoelectric-side terminal forming portions 47.

As shown in FIGS. 2 and 3A, the piezoelectric-side terminal forming portions 47 include terminal opening portions 49.

One piece of terminal opening portion 49 is formed in each of the one pair of rear piezoelectric-side terminal forming portions 43 of the base portion-insulating layer 38 and each of the one pair of front piezoelectric-side terminal forming portions 44 of the stage insulating layer 39. The terminal opening portions 49 are formed so as to pass through the rear piezoelectric-side terminal forming portions 43 and the front piezoelectric-side terminal forming portions 44 in the thickness direction in generally rectangular shapes.

As shown in FIG. 2, the bridged portion 36 includes one pair of curved portions 52 connecting the front ends of the one pair of outrigger portions 17 to both ends in the widthwise direction of the stage 22 in curved shapes and an E-shaped portion 53 connecting the front ends of the one pair of outrigger portions 17 to the front end of the stage 22.

The curved portions 52 extend from the front ends of the outrigger portions 17 toward obliquely inner front side in the widthwise direction in curved shapes to reach both ends in the widthwise direction of the stage 22.

The E-shaped portion 53 has a generally E-shape in plan view. To be specific, the E-shaped portion 53 extends forwardly from the front ends of both of the outrigger portions 17; thereafter, bends inwardly in the widthwise direction; extends inwardly in the widthwise direction to be unified; and then, bends rearwardly to reach the center in the widthwise direction of the front end of the stage 22.

The base insulating layer 9 is, for example, formed of an insulating material such as a synthetic resin. Examples of the synthetic resin include polyimide resin, polyamide imide resin, acrylic resin, polyether nitrile resin, polyether sulfone resin, polyethylene terephthalate resin, polyethylene naphthalate resin, and polyvinyl chloride resin. Preferably, the base insulating layer 9 is formed of polyimide resin.

The base insulating layer 9 has a thickness (maximum thickness) of, for example, 1 μm or more, or preferably 3 μm or more and, for example, 35 μm or less, or preferably 33 μm or less.

As shown in FIG. 1, the conductor layer 10 includes the external terminals 57, the head-side terminals 58 as one example of the connecting terminal, the piezoelectric-side terminals 59, and the wires 60.

The plurality (six pieces) of external terminals 57 are disposed at the rear end portion of the main body portion-insulating layer 31 corresponding to the main body portion 13. The external terminals 57 include signal terminals 57A and power source terminals 57B.

Of the plurality (six pieces) of external terminals 57, four pieces thereof disposed at the rear side are the signal terminals 57A. The signal terminals 57A are disposed at spaced intervals to each other in the widthwise direction. The signal terminals 57A are electrically connected to the external board 6.

Of the plurality (six pieces) of external terminals 57, two pieces thereof disposed at the front side are the power source terminals 57B. The power source terminals 57B are disposed at spaced intervals to each other in the widthwise direction. The power source terminals 57B are electrically connected to the power source 7.

As shown in FIG. 2, the plurality (four pieces) of head-side terminals 58 are provided on the upper surface of the front end portion of the stage insulating layer 39 corresponding to the stage 22 and disposed at spaced intervals to each other in the widthwise direction. As shown in FIGS. 3A and 3B, the head-side terminal 58 extends in the front-rear direction so as to traverse the front end edge of the stage opening portion 27 and the front end edge of the connecting terminal-opening portion 45. The head-side terminal 58 is electrically connected to the magnetic head 3 via a head connecting material 66 to be described later. The head-side terminal 58 includes a front-side portion 58A, a central portion 58B, and a rear-side portion 58C.

The front-side portion 58A is a front-side portion with respect to the front end edge of the stage opening portion 27 in the head-side terminal 58. The front-side portion 58A is, when projected in the thickness direction, overlapped with the metal supporting board 8 and the base insulating layer 9. The front-side portion 58A supports the head-side terminal 58.

The central portion 58B is a portion between the front end edge of the stage opening portion 27 and the front end edge of the connecting terminal-opening portion 45 in the head-side terminal 58. The central portion 58B extends continuously from the rear end portion of the front-side portion 58A. The central portion 58B is, when projected in the thickness direction, overlapped with the base insulating layer 9. The central portion 58B is disposed at the inside of the stage opening portion 27 and supported by the base insulating layer 9.

The rear-side portion 58C is a rear-side portion with respect to the front end edge of the connecting terminal-opening portion 45 in the head-side terminal 58. The rear-side portion 58C bends downwardly continuously from the rear end portion of the central portion 58B to then extend rearwardly. In this manner, the upper surface of the rear-side portion 58C and the upper surface of the central portion 58B form a difference in level. The lower surface of the rear-side portion 58C is flush with the recessed portion 48. The rear-side portion 58C is disposed at the inside of the stage opening portion 27 and can be positioned further closer to the magnetic head 3.

The plurality (four pieces) of piezoelectric-side terminals 59 are disposed in the piezoelectric-side terminal forming portions 47 of the base insulating layer 9 in the communicating spaces 24. To be specific, each of the piezoelectric-side terminals 59 falls in and fills each of the terminal opening portions 49 of the one pair of rear piezoelectric-side terminal forming portions 43 of the base portion-insulating layer 38 and each of the terminal opening portions 49 of the one pair of front piezoelectric-side terminal forming portions 44 of the stage insulating layer 39. As shown in FIGS. 2 and 3A, of the piezoelectric-side terminals 59, the piezoelectric-side terminals 59 filling each of the terminal opening portions 49 of the one pair of rear piezoelectric-side terminal forming portions 43 are defined as rear piezoelectric-side terminals 59A, and the piezoelectric-side terminals 59 filling each of the terminal opening portions 49 of the one pair of front piezoelectric-side terminal forming portions 44 are defined as front piezoelectric-side terminals 59B. The piezoelectric-side terminals 59 are electrically connected to the piezoelectric elements 5 via a piezoelectric connecting material 68 to be described later.

As shown in FIG. 1, the plurality (six pieces) of wires 60 are formed at spaced intervals to each other in the widthwise direction in the main body portion-insulating layer 31 (ref: FIG. 2) corresponding to the main body portion 13 and the gimbal portion-insulating layer 32 (ref: FIG. 2) corresponding to the gimbal portion 14. The wires 60 include signal wires 60A and power source wires 60B.

Of the plurality (six pieces) of wires 60, four pieces thereof at the inner side in the widthwise direction are the signal wires 60A. The signal wires 60A are electrically connected to the signal terminals 57A and the head-side terminals 58. The signal wires 60A transmit electrical signals between the magnetic head 3 (ref: FIGS. 3A and 3B) and the external board 6.

To be specific, the signal wire 60A is formed so as to extend forwardly from the signal terminal 57A at the rear end portion of the main body portion-insulating layer 31 (ref: FIG. 2) corresponding to the main body portion 13 and thereafter, as shown in FIG. 2, sequentially pass over the board opening portion-insulating layer 34 and the mounting portion-insulating layer 35 to reach the head-side terminal 58.

As shown in FIG. 1, of the plurality (six pieces) of wires 60, two pieces thereof at both outer sides in the widthwise direction with respect to the signal wires 60A are the power source wires 60B. The power source wires 60B are electrically connected to the power source terminals 57B and the rear piezoelectric-side terminals 59A. The power source wires 60B supply electric power from the power source 7 to the piezoelectric elements 5.

To be specific, the power source wire 60B is formed so as to extend forwardly from the power source terminal 57B at the rear end portion of the main body portion-insulating layer 31 (ref: FIG. 2) corresponding to the main body portion 13 and thereafter, as shown in FIG. 2, sequentially pass over the board opening portion-insulating layer 34 and the mounting portion-insulating layer 35 to reach the rear piezoelectric-side terminal 59A.

The wires 60 include a plurality (two pieces) of ground wires 60C formed at spaced intervals to each other in the widthwise direction in the gimbal portion-insulating layer 32 corresponding to the gimbal portion 14.

The ground wires 60C are provided so as to ground the front piezoelectric-side terminals 59B. To be specific, as shown in FIGS. 2 and 3A, the ground wire 60C extends forwardly from the front piezoelectric-side terminal 59B, falls in the ground opening portion 46 at the rear side of the signal wire 60A, bends downwardly to be filled, and is brought into contact with the metal supporting board 8.

The conductor layer 10 is, for example, formed of a conductive material such as copper, nickel, gold, solder, or an alloy thereof. Preferably, the conductor layer 10 is formed of copper.

The conductor layer 10 has a thickness of, for example, 3 μm or more, or preferably 5 μm or more and, for example, 50 μm or less, or preferably 20 μm or less.

As shown in FIGS. 3A and 3B, the cover insulating layer 11 includes the first cover insulating layer 71 and the second cover insulating layer 72.

As referred to FIG. 1, the first cover insulating layer 71 is formed over the main body portion 13 and the gimbal portion 14. As shown in FIGS. 3A and 3B, the first cover insulating layer 71 is disposed on the base insulating layer 9 and formed in a pattern including the conductor layer 10 in plan view.

To be specific, the first cover insulating layer 71 is formed in a pattern covering the upper surfaces of the wires 60 and exposing the upper surfaces of the external terminals 57 (ref: FIG. 1) and the head-side terminals 58.

The first cover insulating layer 71 is formed of the same insulating material as that of the base insulating layer 9. The thickness of the first cover insulating layer 71 is thinner than that of the plating layer 12. The thickness of the first cover insulating layer 71 with respect to 100% of the thickness of the plating layer 12 is, for example, 10% or more, or preferably 30% or more and, for example, 99% or less, or preferably 90% or less. To be specific, the first cover insulating layer 71 has a thickness of, for example, 1 μm or more, or preferably 3 μm or more and, for example, 40 μm or less, or preferably 10 μm or less.

The second cover insulating layer 72 is disposed on the first cover insulating layer 71. The second cover insulating layer 72 includes a terminal circumferential layer 77, one pair of front-side slider contact layers 78 as one example of the second cover pedestal layer, and a rear-side slider contact layer 79 as one example of the second cover pedestal layer.

The terminal circumferential layer 77 is disposed on the first cover insulating layer 71 at the front side with respect to the head-side terminals 58 so as to expose the upper surfaces of the head-side terminals 58. The terminal circumferential layer 77 is, when projected in the thickness direction, formed so as to be overlapped with the signal wires 60A. The terminal circumferential layer 77 has a generally rectangular shape in plan view extending in the widthwise direction so as to be overlapped with all of the four pieces of head-side terminals 58, when projected in the front-rear direction, at the front sides of the four pieces of head-side terminals 58.

Each of the one pair of front-side slider contact layers 78 is disposed on the first cover insulating layer 71 between the two pieces of ground opening portions 46 and the connecting terminal-opening portion 45. The front-side slider contact layers 78 are, when projected in the thickness direction, formed so as to be overlapped with the signal wires 60A. The front-side slider contact layer 78 has a generally rectangular shape in plan view. The one pair of front-side slider contact layers 78 are disposed at spaced intervals to each other in the widthwise direction.

Portions of the first cover insulating layer 71 that are overlapped with the one pair of front-side slider contact layers 78, when projected in the thickness direction, are front-side slider supporting layers 81 as one example of the first cover pedestal layer.

Portions of the base insulating layer 9 that are overlapped with the one pair of front-side slider contact layers 78, when projected in the thickness direction, are front-side base layers 82 as one example of the base pedestal layer.

In this manner, the front-side base layers 82 are made of the base insulating layer 9 and disposed on the metal supporting board 8. The front-side slider supporting layers 81 are made of the first cover insulating layer 71 and disposed on the front-side base layers 82. The front-side slider contact layers 78 are made of the second cover insulating layer 72 and disposed on the front-side slider supporting layers 81.

A first pedestal 88 as one example of the pedestal is formed of the front-side slider contact layer 78, the front-side slider supporting layer 81, and the front-side base layer 82. That is, the one pair of first pedestals 88 are provided. The one pair of first pedestals 88 are disposed at spaced intervals to each other in the widthwise direction.

The rear-side slider contact layer 79 is formed on the central portion-insulating layer 40. The rear-side slider contact layer 79 is, when projected in the thickness direction, formed so as to be overlapped with the signal wires 60A. The rear-side slider contact layer 79 has a generally rectangular shape in plan view.

A portion of the first cover insulating layer 71 that is overlapped with the rear-side slider contact layer 79, when projected in the thickness direction, is a rear-side slider supporting layer 84 as one example of the first cover pedestal layer.

A portion of the base insulating layer 9 that is overlapped with the rear-side slider contact layer 79, when projected in the thickness direction, is a rear-side base layer 85 as one example of the base pedestal layer.

In this manner, the rear-side base layer 85 is made of the base insulating layer 9 and disposed on the metal supporting board 8. The rear-side slider supporting layer 84 is made of the first cover insulating layer 71 and disposed on the rear-side base layer 85. The rear-side slider contact layer 79 is made of the second cover insulating layer 72 and disposed on the rear-side base layer 85.

A second pedestal 89 as one example of the pedestal is formed of the rear-side slider contact layer 79, the rear-side slider supporting layer 84, and the rear-side base layer 85. The second pedestal 89 is disposed at the rear side with respect to the one pair of first pedestals 88 and at generally the center in the widthwise direction of the one pair of first pedestals 88. That is, the second pedestal 89 and the one pair of first pedestals 88 are disposed in a generally triangular shape with each of them as an apex.

The second cover insulating layer 72 is formed of the same insulating material as that of the base insulating layer 9. The thickness of the second cover insulating layer 72 is thinner than that of the plating layer 12. The thickness of the second cover insulating layer 72 with respect to 100% of the thickness of the plating layer 12 is, for example, 10% or more, or preferably 30% or more and, for example, 99% or less, or preferably 90% or less. To be specific, the second cover insulating layer 72 has a thickness of, for example, 1 μm or more, or preferably 3 μm or more and, for example, 10 μm or less, or preferably 5 μm or less.

The plating layer 12 is formed on the surfaces of the plurality of terminals, to be specific, the external terminals 57, the head-side terminals 58, and the piezoelectric-side terminals 59. The plating layer 12 is, for example, formed by plating such as electroless plating or electrolytic plating, or preferably by electrolytic plating. The plating layer 12 is, for example, formed of a metal material such as nickel and gold. Preferably, the plating layer 12 is formed of gold. The thickness of the plating layer 12 is not more than the total sum of the thickness of the first cover insulating layer 71 and that of the second cover insulating layer 72. To be specific, the thickness of the plating layer 12 with respect to 100% of the total sum of the thickness of the first cover insulating layer 71 and that of the second cover insulating layer 72 is, for example, 5% or more, or preferably 30% or more and, for example, 99% or less, or preferably 95% or less. To be specific, the plating layer 12 has a thickness of, for example, 0.3 μm or more, or preferably 2 μm or more and, for example, 10 μm or less, or preferably 5 μm or less.

Portions of the plating layer 12 that are formed on the surfaces of the head-side terminals 58 are defined as head plating layers 91.

The head plating layer 91 is provided corresponding to the shape of the head-side terminal 58. To be specific, the head plating layer 91 covers the upper and both side surfaces of the front-side portion 58A, the upper and both side surfaces of the central portion 58B, and the upper, both side, the rear, and the lower surfaces of the rear-side portion 58C of the head-side terminal 58. That is, the head plating layer 91 is formed so as to go around the upper surface to the lower surface of the head-side terminal 58. The head plating layer 91 covering the upper surface of the central portion 58B and the head plating layer 91 covering the upper surface of the rear-side portion 58C form a difference in level.

The front end of the slider 4 is mounted with the magnetic head 3 that is capable of reading and writing the information of a hard disk. The slider 4 has a generally rectangular box shape in plan view. A plurality (four pieces) of head terminals 65 are provided at the front end of the magnetic head 3 corresponding to the plurality of head-side terminals 58.

The head terminals 65 are disposed at the front end surface of the magnetic head 3 and positioned upwardly with respect to the lower end portion of the magnetic head 3. The head terminal 65 has a length in the thickness direction and provided to face forwardly.

The slider 4 is placed on the one pair of first pedestals 88 and the second pedestal 89 via an adhesive or the like. The slider 4 is disposed at the upper sides of the head-side terminals 58 at minute spaced intervals thereto so that the head terminals 65 face the upper surfaces of the head-side terminals 58.

The head connecting material 66 is provided on the upper surface of the head-side terminal 58.

The head connecting material 66 is, for example, formed of an electrically conductive material such as solder and an electrically conductive adhesive. Preferably, the head connecting material 66 is formed of low melting point solder. Examples of the low melting point solder include solder made of an alloy of tin, silver and copper; solder made of an alloy of tin, silver, bismuth, and indium; solder made of an alloy of tin and zinc; solder made of an alloy of tin and bismuth; and solder made of an alloy of tin, bismuth, and silver. The melting point of the low melting point solder is preferably 220° C. or less. An example of the electrically conductive adhesive includes silver paste.

The head connecting material 66 electrically connects the head-side terminal 58 to the head terminal 65 of the magnetic head 3.

In this manner, by adjusting the thickness of the plating layer 12, the plating layer 12 is brought closer to the head terminals 65 of the magnetic head 3 mounted on the slider 4.

The piezoelectric element 5 is an actuator that is capable of extending and contracting in the front-rear direction. The piezoelectric element 5 has a generally rectangular shape in plan view extending in the front-rear direction. By supplying electric power to the piezoelectric element 5 and controlling its voltage, the piezoelectric element 5 extends and contracts. Piezoelectric terminals 67 are provided at each of the front side and the rear side of the upper portion of the piezoelectric element 5. As shown in FIGS. 2 and 3A, the one pair of piezoelectric elements 5 are disposed at spaced intervals to each other in the widthwise direction. At this time, the piezoelectric element 5 is disposed so that the rear piezoelectric-side terminal 59A and the front piezoelectric-side terminal 59B are disposed across the suspension board with circuit 1 from the lower side thereof, and the piezoelectric terminals 67 face the lower surfaces of the piezoelectric-side terminals 59.

The piezoelectric connecting material 68 is provided on the upper surface of the piezoelectric-side terminal 59. The piezoelectric connecting material 68 is, for example, formed of the same electrically conductive material as that of the head connecting material 66.

The piezoelectric connecting material 68 electrically connects the piezoelectric-side terminal 59 to the piezoelectric terminal 67 of the piezoelectric element 5.

Next, a method for producing the suspension board with circuit 1 is described with reference to FIGS. 4A to 6I.

In the method, as shown in FIG. 4A, first, the metal supporting board 8 is prepared.

Next, as shown in FIG. 4B, the base insulating layer 9 is formed on the metal supporting board 8.

To be specific, the base insulating layer 9 is formed on the metal supporting board 8 in a pattern corresponding to the main body portion-insulating layer 31 (ref: FIG. 1) and the gimbal portion-insulating layer 32. The gimbal portion-insulating layer 32 is formed in a pattern including the front-side base layers 82, the rear-side base layer 85, concave portions 93 in portions corresponding to the head-side terminals 58, and the connecting terminal-opening portion 45.

The concave portions 93 are formed at the front end portion of the connecting terminal-opening portion 45 so as to dent from the upper surface of the base insulating layer 9 downwardly.

In order to form the base insulating layer 9 where the concave portions 93 and the connecting terminal-opening portion 45 are formed, a varnish of a photosensitive insulating material is applied onto the metal supporting board 8 to be then dried, thereby forming a base film.

Thereafter, the obtained base film is exposed to light via a photomask that is not shown. The photomask includes a light shielding portion, a light semi-transmitting portion, and a light fully transmitting portion in a pattern. The light fully transmitting portion to a portion where the base insulating layer 9 (excluding portions where the concave portions 93 and the connecting terminal-opening portion 45 are formed) is formed, the light semi-transmitting portion to a portion where the concave portions 93 are formed, and the light shielding portion to a portion where the base insulating layer 9 is not formed and the connecting terminal-opening portion 45 is formed are disposed in opposed relation to the base film to be then exposed to light.

Thereafter, the base film is developed and cured by heating as needed, thereby forming the base insulating layer 9 including the front-side base layers 82, the rear-side base layer 85, the concave portions 93, and the connecting terminal-opening portion 45 in the above-described pattern.

Next, as shown in FIG. 4C, the conductor layer 10 is formed on the upper surface of the base insulating layer 9. To be more specific, the conductor layer 10 is formed on the upper surface of the base insulating layer 9 by a pattern forming method such as an additive method or a subtractive method, or preferably by an additive method.

In this manner, as referred to FIG. 1, the conductor layer 10 is formed on the upper surface of the base insulating layer 9 so as to include the external terminals 57, the head-side terminals 58, the piezoelectric-side terminals 59, and the wires 60. The rear-side portion of the head-side terminal 58 is formed so as to fall in the concave portion 93.

Next, as shown in FIG. 5D, the first cover insulating layer 71 is formed on the base insulating layer 9 in a pattern including the one pair of front-side slider supporting layers 81 and the rear-side slider supporting layer 84. In order to form the first cover insulating layer 71 including the one pair of front-side slider supporting layers 81 and the rear-side slider supporting layer 84, a varnish of a photosensitive insulating material is applied onto the base insulating layer 9 and the conductor layer 10 to be then dried. After forming a cover film, the obtained cover film is exposed to light and subsequently, developed to be then cured by heating. In this manner, the first cover insulating layer 71 is formed in the above-described pattern.

Next, as shown in FIG. 5E, the second cover insulating layer 72 is formed on the first cover insulating layer 71.

To be specific, the second cover insulating layer 72 is formed in a pattern including the terminal circumferential layer 77, the one pair of front-side slider contact layers 78 (ref: FIGS. 2 and 3A), and the rear-side slider contact layer 79. In order to form the second cover insulating layer 72 including the terminal circumferential layer 77, the one pair of front-side slider contact layers 78 (ref: FIGS. 2 and 3A), and the rear-side slider contact layer 79, a varnish of a photosensitive insulating material is applied onto the first cover insulating layer 71 to be then dried. After forming a cover film, the obtained cover film is exposed to light and subsequently, developed to be then cured by heating. In this manner, the second cover insulating layer 72 is formed in the above-described pattern.

In this manner, as referred to FIG. 3A, the front-side slider contact layers 78 constitute the first pedestals 88 along with the corresponding front-side slider supporting layers 81 of the first cover insulating layer 71 and the front-side base layers 82 of the base insulating layer 9.

As shown in FIG. 5E, the rear-side slider contact layer 79 constitutes the second pedestal 89 along with the corresponding rear-side slider supporting layer 84 of the first cover insulating layer 71 and the rear-side base layer 85 of the base insulating layer 9.

Next, as shown in FIG. 5F, the metal supporting board 8 is, for example, processed by etching or the like so that the board opening portion 16 (ref: FIGS. 1 and 2) and the stage opening portion 27 are formed.

In this manner, the lower surface of the base insulating layer 9 of the portions where the concave portions 93 are formed is exposed from the stage opening portion 27.

Figure 6G:
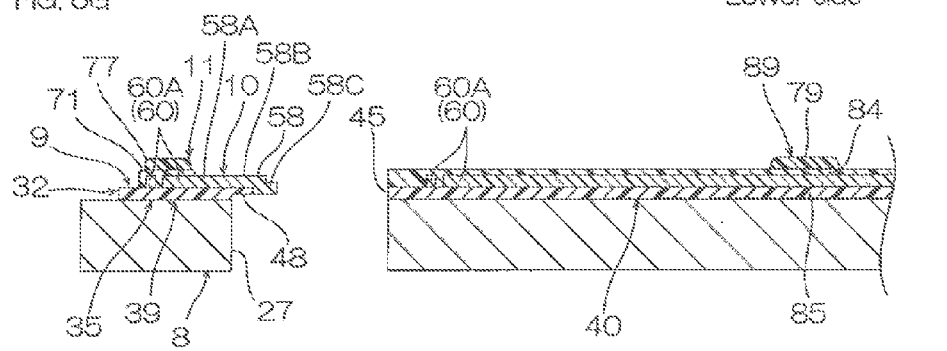
FIGS. 6G to 6I, subsequent to FIG. 5F, show process drawings for illustrating a method for producing the suspension board with circuit shown in FIG. 3B.

Next, as shown in FIG. 6G, in the base insulating layer 9, the portions exposed from the stage opening portion 27 where the concave portions 93 are formed, and the front-side portion of the base insulating layer 9 with respect to the concave portions 93 are partially removed, to be specific, by etching, or preferably by wet etching or the like.

In this manner, the recessed portion 48 is formed and the lower surfaces of the rear-side portions 58C of the head-side terminals 58 are exposed.

Figure 6H:
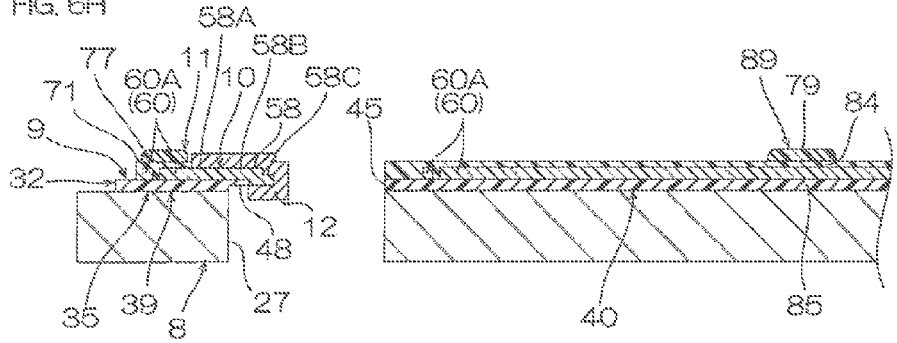

Next, as shown in FIG. 6H, the plating layer 12 is formed on the surfaces of the plurality of terminals, to be specific, the external terminals 57, the head-side terminals 58, and the piezoelectric-side terminals 59.

To be specific, the plating layer 12 is formed by plating such as electroless plating or electrolytic plating, or preferably by electrolytic plating.

In this manner, the suspension board with circuit 1 is completed.

Figure 6I:
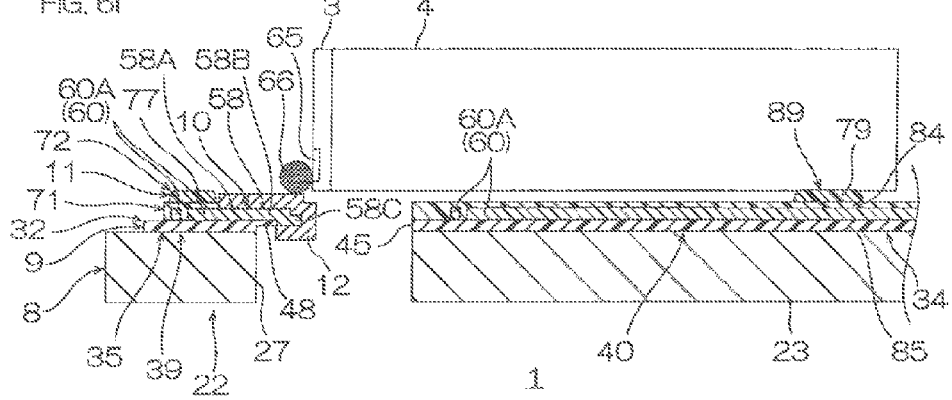

Next, as shown in FIG. 6I, when the slider 4 mounted with the magnetic head 3 is connected to the suspension board with circuit 1, first, the head connecting material 66 is formed on the head-side terminal 58 (the plating layer 12). To be specific, the above-described electrically conductive material is printed with a known printer or applied with a dispenser, thereby forming the head connecting material 66.

Next, the slider 4 mounted with the magnetic head 3 is disposed at the upper side of the suspension board with circuit 1 so that the slider 4 is supported by the one pair of first pedestals 88 (ref: FIGS. 2 and 3A) and the second pedestal 89, and the head terminals 65 are positioned at the upper sides of the head-side terminals 58.

Then, the head connecting material 66 is heated at a temperature of not less than the melting point thereof by a heating method such as laser (Xe lamp laser) application or soldering iron. Preferably, the head connecting material 66 is heated by laser application.

In this manner, as shown in FIGS. 3A and 3B, the head connecting material 66 is melted and flows, so that the head-side terminal 58 is electrically connected to the head terminal 65 of the magnetic head 3.

At this time, the head connecting material 66 forms a fillet, so that the head connecting material 66 can be surely disposed till the upper end portion of the head terminal 65, and the head-side terminal 58 can be surely electrically connected to the head terminal 65.

As shown in FIG. 3A, when the piezoelectric elements 5 are connected to the suspension board with circuit 1, first, the piezoelectric connecting material 68 is formed below the piezoelectric-side terminal 59. To be specific, the above-described electrically conductive material is printed with a known printer or applied with a dispenser, thereby forming the piezoelectric connecting material 68.

The one pair of piezoelectric elements 5 are disposed at the lower side of the suspension board with circuit 1 so that the piezoelectric terminals 67 are positioned at the lower sides of the corresponding piezoelectric-side terminals 59.

Next, the gimbal portion 14 of the suspension board with circuit 1 where the piezoelectric elements 5 are disposed is put into a reflow oven and heated, so that the piezoelectric connecting material 68 is subjected to reflowing.

The reflow temperature is not less than the temperature at which the piezoelectric connecting material 68 is melted and, for example, 100° C. or more, or preferably 130° C. or more and, for example, 350° C. or less, or preferably 300° C. or less.

The reflow time is, for example, 5 seconds or more, or preferably 10 seconds or more and, for example, 500 seconds or less, or preferably 300 seconds or less.

In this manner, the piezoelectric connecting material 68 flows by being melted to connect the piezoelectric-side terminal 59 to the piezoelectric terminal 67 of the piezoelectric element 5.

By supplying electric power to the piezoelectric element 5 from the power source 7 via the piezoelectric-side terminal 59 and controlling its voltage, the piezoelectric element 5 extends and contracts in the front-rear direction. The position of the slider 4 can be precisely and finely adjusted by extending and contracting of the piezoelectric elements 5.

According to the suspension board with circuit 1, as shown in FIGS. 3A and 3B, when the plating layer 12 covering the head-side terminal 58 is formed thick for the adjustment of the height, the plating layer 12 can be surely protected by the first cover insulating layer 71 formed around the head-side terminals 58 and the terminal circumferential layer 77 of the second cover insulating layer 72.

Also, in accordance with the position of the slider 4, the thickness of the plating layer 12 is appropriately adjusted within the total sum of the thickness of the first cover insulating layer 71 and that of the terminal circumferential layer 77 of the second cover insulating layer 72, and the plating layer 12 can be brought closer to the head terminals 65 of the magnetic head 3 mounted on the slider 4 in the thickness direction.

Thus, the head-side terminals 58 can be surely connected to the head terminals 65 of the magnetic head 3 mounted on the slider 4.

According to the suspension board with circuit 1, as shown in FIGS. 3A and 3B, the front-side base layers 82 and the rear-side base layer 85 are made of the base insulating layer 9, the front-side slider supporting layers 81 and the rear-side slider supporting layer 84 are made of the first cover insulating layer 71, and the front-side slider contact layers 78 and the rear-side slider contact layer 79 are made of the second cover insulating layer 72, so that the first pedestals 88 and the second pedestal 89 can be formed by covering the wires 60 without separately providing a member so as to support the slider 4.

According to the method for producing the suspension board with circuit 1, in the steps of forming the first cover insulating layer 71 and the second cover insulating layer 72 so as to protect the plating layer 12 of the head-side terminals 58, the front-side slider supporting layers 81 and the rear-side slider supporting layer 84, and the front-side slider contact layers 78 and the rear-side slider contact layer 79 can be simultaneously formed.

Thus, the first pedestals 88 and the second pedestal 89 can be efficiently formed without separately adding a step, while the plating layer 12 can be protected by the cover insulating layer 11.

Second Embodiment

Next, a second embodiment of the suspension board with circuit 1 of the present invention is described with reference to FIG. 7. In the second embodiment, the same reference numerals are provided for members corresponding to each of those in the above-described first embodiment, and their detailed description is omitted.

In the above-described first embodiment, by adjuring the thickness of the plating layer 12, the plating layer 12 is brought closer to the head terminals 65 of the magnetic head 3 mounted on the slider 4.

Figure 7:
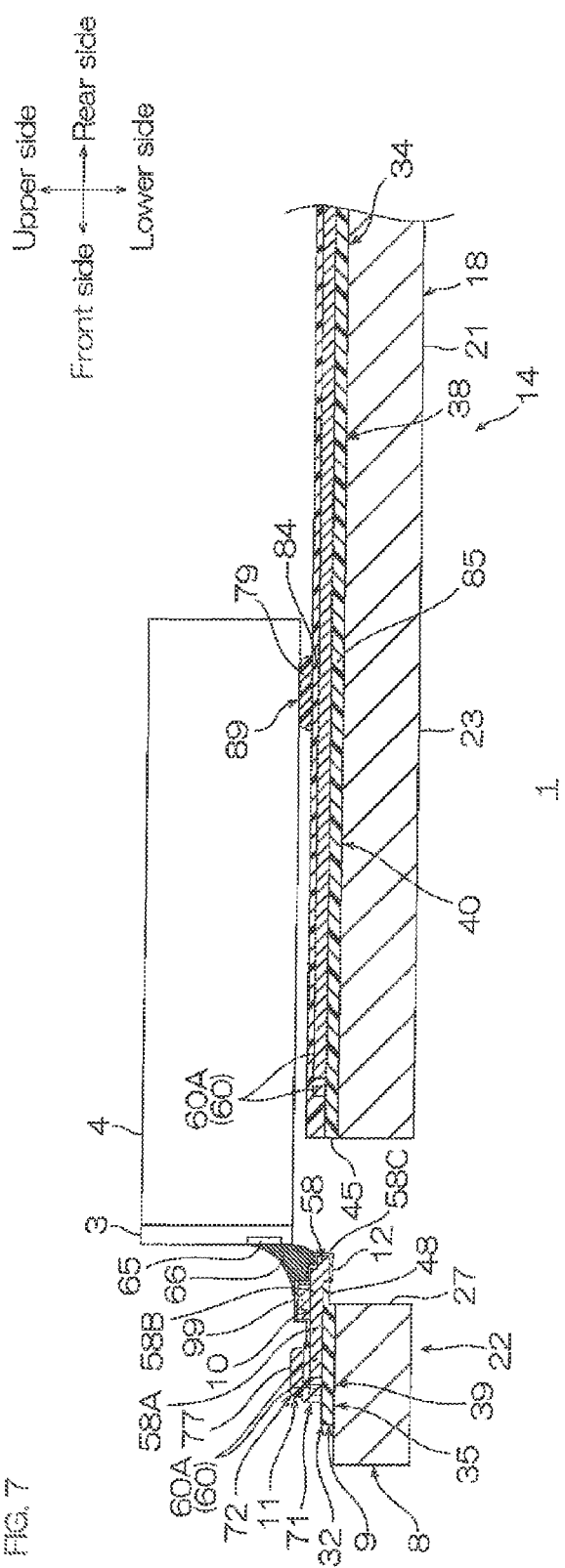
FIG. 7 shows a sectional view of a second embodiment of a suspension board with circuit of the present invention corresponding to FIG. 3B.

In contrast, in the second embodiment, as shown in FIG. 7, the suspension board with circuit 1 includes an additional plating layer 99 as one example of the plating layer between the head-side terminal 58 and the plating layer 12.

The additional plating layer 99 is formed on the head-side terminal 58. To be specific, the additional plating layer 99 is disposed so as to traverse the front-side portion 58A and the central portion 58B of the head-side terminal 58. The additional plating layer 99 is, for example, formed of a conductive material such as copper, nickel, gold, solder, or an alloy thereof. Preferably, the additional plating layer 99 is formed of copper. The additional plating layer 99 has a thickness of, for example, 1 μm or more, or preferably 2 μm or more and, for example, 10 μm or less, or preferably 5 μm or less.

In the second embodiment, the plating layer 12 has a thickness of, for example, 0.3 μm or more, or preferably 2 μm or more and, for example, 10 μm or less, or preferably 5 μm or less.

The additional plating layer 99 is thicker than the plating layer 12. The thickness of the additional plating layer 99 with respect to 100% of the thickness of the plating layer 12 is, for example, 110% or more, or preferably 200% or more and, for example, 1000% or less, or preferably 500% or less.

The total sum of the thickness of the additional plating layer 99 and that of the plating layer 12 formed on the surface of the additional plating layer 99 is not more than the total sum of the thickness of the first cover insulating layer 71 and that of the second cover insulating layer 72. To be specific, the total sum of the thickness of the additional plating layer 99 and that of the plating layer 12 formed on the surface of the additional plating layer 99 with respect to 100% of the total sum of the thickness of the first cover insulating layer 71 and that of the second cover insulating layer 72 is, for example, 5% or more, or preferably 30% or more and, for example, 99% or less, or preferably 95% or less.

The additional plating layer 99 is formed by plating after forming the conductor layer 10 on the upper surface of the base insulating layer 9. Either electrolytic plating or electroless plating may be used, preferably, electrolytic plating is used, or particularly preferably, electrolytic copper plating is used.

In the second embodiment, the same function and effect as that of the first embodiment can be obtained.

Modified Example

In the above-described first and second embodiments, the suspension board with circuit 1 includes the first pedestal 88 and the second pedestal 89 so as to support the slider 4. However, the slider 4 may be also supported by an adhesive layer or the like without including the first pedestal 88 and the second pedestal 89.

In the modified example, the same function and effect as that of the first and second embodiments can be obtained.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
a metal supporting board, a base insulating layer disposed at one side in a thickness direction of the metal supporting board, a conductor layer disposed at the one side in a thickness direction of the base insulating layer and including a connecting terminal electrically connected to a slider, a cover insulating layer covering the conductor layer so as to expose the connecting terminal and disposed at the one side in the thickness direction of the base insulating layer, and a plating layer covering the connecting terminal, wherein
the cover insulating layer includes
a first cover insulating layer disposed at the one side in the thickness direction of the base insulating layer and
a second cover insulating layer disposed at the one side in a thickness direction of the first cover insulating layer, and
a thickness of the plating layer is not more than a total sum of a thickness of the first cover insulating layer and that of the second cover insulating layer.

2. The suspension board with circuit according to claim 1 further comprising:
a pedestal supporting the slider, wherein
the pedestal includes
a base pedestal layer made of the base insulating layer and disposed at the one side in the thickness direction of the metal supporting board,
a first cover pedestal layer made of the first cover insulating layer and disposed at the one side in a thickness direction of the base pedestal layer, and
a second cover pedestal layer made of the second cover insulating layer and disposed at the one side in a thickness direction of the first cover pedestal layer.

3. A method for producing a suspension board with circuit according to claim 2 comprising the steps of:
preparing the metal supporting board,
forming the base insulating layer including the base pedestal layer at the one side in the thickness direction of the metal supporting board,
forming the conductor layer including the connecting terminal at the one side in the thickness direction of the base insulating layer,
forming the first cover insulating layer at the one side in the thickness direction of the base insulating layer so as to dispose the first cover pedestal layer at the one side in the thickness direction of the base pedestal layer,
forming the second cover insulating layer at the one side in the thickness direction of the first cover insulating layer so as to dispose the second cover pedestal layer at the one side in the thickness direction of the first cover pedestal layer, and
forming the plating layer in the connecting terminal.

* * * * *